(12) United States Patent
Jeong et al.

(10) Patent No.: US 7,372,722 B2
(45) Date of Patent: **\*May 13, 2008**

(54) METHODS OF OPERATING MAGNETIC RANDOM ACCESS MEMORY DEVICES INCLUDING HEAT-GENERATING STRUCTURES

(75) Inventors: Won-Cheol Jeong, Seoul (KR); Jae-Hyun Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/263,521

(22) Filed: Oct. 31, 2005

(65) Prior Publication Data

US 2006/0062044 A1     Mar. 23, 2006

Related U.S. Application Data

(63) Continuation-in-part of application No. 10/795,600, filed on Mar. 8, 2004, now Pat. No. 7,092,283, and a continuation-in-part of application No. 11/201,495, filed on Aug. 11, 2005, now Pat. No. 7,164,598.

(30) Foreign Application Priority Data

| Sep. 29, 2003 | (KR) | ................................ 2003-67530 |
| Aug. 12, 2004 | (KR) | ................................ 2004-63641 |
| Nov. 3, 2004 | (KR) | ....................... 10-2004-0088999 |

(51) Int. Cl.
*G11C 11/00*     (2006.01)
*G11C 11/34*     (2006.01)

(52) U.S. Cl. ........................ 365/158; 365/171; 365/173

(58) Field of Classification Search ................. 365/158, 365/171, 173, 94; 156/235
See application file for complete search history.

(56) References Cited

U.S. PATENT DOCUMENTS

| 6,097,625 | A | * | 8/2000 | Scheuerlein | ................. 365/171 |
| 6,130,814 | A | | 10/2000 | Sun | |
| 6,163,477 | A | | 12/2000 | Tran | |

(Continued)

FOREIGN PATENT DOCUMENTS

EP     1 376 602 A2     1/2004

(Continued)

OTHER PUBLICATIONS

Boeck et al. "Spintronics, a New Nanoelectronics Adventure" thinfilmmfg.com 5 pages (2002) <http://www.thinfilmmfg.com/subscribers/Subscriber02/spin1May02.htm> Accessed online on May 20, 2005.

(Continued)

*Primary Examiner*—Trong Phan
(74) *Attorney, Agent, or Firm*—Myers, Bigel, Sibley & Sajovec, P.A.

(57) ABSTRACT

Methods may be provided for operating a magnetic random access memory (MRAM device including a magnetic tunnel junction structure and a heat generating layer. More particularly, a write current may be provided through the magnetic tunnel junction structure and through the heat generating layer, and the write current may have a magnitude sufficient to change a program state of the magnetic tunnel junction structure. Related devices are also discussed.

30 Claims, 5 Drawing Sheets

U.S. PATENT DOCUMENTS

| | | | |
|---|---|---|---|
| 6,385,082 B1 | 5/2002 | Abraham et al. | |
| 6,385,083 B1 | 5/2002 | Sharma et al. | |
| 6,430,085 B1 | 8/2002 | Rizzo | |
| 6,509,621 B2 | 1/2003 | Nakao | |
| 6,545,906 B1 | 4/2003 | Savtchenko et al. | |
| 6,560,135 B2 | 5/2003 | Matsuoka et al. | |
| 6,574,129 B1* | 6/2003 | Tran | 365/94 |
| 6,603,677 B2 | 8/2003 | Redon et al. | |
| 6,603,678 B2 | 8/2003 | Nickel et al. | |
| 6,720,597 B2 | 4/2004 | Janesky et al. | |
| 6,724,651 B2 | 4/2004 | Hirai | |
| 6,724,674 B2 | 4/2004 | Abraham et al. | |
| 6,744,651 B2* | 6/2004 | Tang | 365/158 |
| 6,762,953 B2 | 7/2004 | Tanizaki et al. | |
| 6,771,534 B2 | 8/2004 | Stipe | |
| 6,791,874 B2 | 9/2004 | Tran et al. | |
| 6,794,696 B2 | 9/2004 | Fukuzumi | |
| 6,803,619 B2* | 10/2004 | Hosotani et al. | 365/158 |
| 6,842,361 B2* | 1/2005 | Miyatke et al. | 365/158 |
| 6,870,757 B2 | 3/2005 | Hidaka | |
| 6,894,919 B2 | 5/2005 | Fukuzumi | |
| 6,898,113 B2 | 5/2005 | Tsuji | |
| 6,906,941 B2* | 6/2005 | Tran et al. | 365/171 |
| 6,926,790 B2* | 8/2005 | Weed | 156/235 |
| 6,947,314 B2* | 9/2005 | Yoda et al. | 365/158 |
| 6,947,315 B2* | 9/2005 | Iwata | 365/158 |
| 6,952,364 B2* | 10/2005 | Lee et al. | 365/158 |
| 6,954,374 B2* | 10/2005 | Hidaka | 365/171 |
| 6,970,378 B2* | 11/2005 | Hidaka | 365/158 |
| 6,980,468 B1* | 12/2005 | Ounadjela | 365/171 |
| 6,992,924 B2* | 1/2006 | Miyatake et al. | 365/171 |
| 6,992,935 B2 | 1/2006 | Ooishi | |
| 6,999,340 B2* | 2/2006 | Shimizu | 365/158 |
| 6,999,341 B2* | 2/2006 | Ooishi | 365/171 |
| 6,999,342 B2* | 2/2006 | Ooishi | 365/171 |
| 7,009,873 B2* | 3/2006 | Yoda et al. | 365/158 |
| 7,009,877 B1* | 3/2006 | Huai et al. | 365/171 |
| 7,061,037 B2* | 6/2006 | Ju et al. | 365/158 |
| 7,068,536 B2* | 6/2006 | Matsutera et al. | 365/171 |
| 7,092,283 B2 | 8/2006 | Jeong et al. | |
| 7,095,648 B2* | 8/2006 | Ditewig et al. | 365/158 |
| 7,105,879 B2* | 9/2006 | Lin et al. | 365/158 |
| 7,164,598 B2 | 1/2007 | Jeong et al. | |
| 7,190,613 B2* | 3/2007 | Nagase et al. | 365/171 |
| 2002/0141231 A1 | 10/2002 | Komori | |
| 2002/0176277 A1 | 11/2002 | Bessho et al. | |
| 2003/0170976 A1 | 9/2003 | Molla et al. | |
| 2004/0233748 A1* | 11/2004 | Terao et al. | |
| 2005/0078510 A1 | 4/2005 | Jeong et al. | |

FOREIGN PATENT DOCUMENTS

| | | |
|---|---|---|
| JP | 2001-084757 | 3/2001 |
| JP | 2001/084758 | 3/2001 |
| JP | 2001-250206 | 9/2001 |
| JP | 2002-319664 | 10/2002 |
| JP | 2003-060173 | 2/2003 |
| JP | 102003060173 | 2/2003 |
| JP | 2003/298025 | 10/2003 |
| JP | 2004/087519 | 3/2004 |
| JP | 2002-319664 | 10/2005 |
| KR | 1020020046036 | 6/2002 |
| KR | 1020030040027 | 5/2003 |
| KR | 1020040000634 | 1/2004 |
| KR | 1020040003479 | 1/2004 |
| KR | 1020040026619 | 3/2004 |
| KR | 1020040038420 | 5/2004 |
| WO | WO 00/04551 | 1/2000 |
| WO | WO 03/092014 A1 | 11/2003 |
| WO | WO 03/094170 A2 | 11/2003 |
| WO | WO 2004/049344 | 6/2004 |

OTHER PUBLICATIONS

Deak "Spin Injection in Thermally Assisted Magnetic Random Access Memory" 15 pages <http://www.nve.com/advpdf/49th_MMM_spin_injection_TA_MRAM.pdf> Accessed online on Jun. 20, 2005.

Fert et al. "The New Era of Spintronics" *Europhysics News* 34(6) 7 pages (2003) <http://www.europhysicsnews.com/full/24/article9/article9.html> Accessed online on Jun. 20, 2005.

Johnson "Magnetic Spin Locks data into MRAMs" *EETimes Online* (Jul. 17, 2001) 4 pages <http://www.eetimes.com/story/OEG20010717S0064> Accessed online on Apr. 18, 2005.

Translation of an Office Action issued by German Patent and Trademark Office Feb. 16, 2006 for 10-2004-043-264.3-33.

English translation of Korean Application 10-2003-0067530.

Statement of Accuracy of a translation for 10-2003-0067530.

Office Action issued by Korean Intellectual Property Office for Korean Application No. 10-2003-0067530 on Jul. 18, 2005.

Office Action issued by Korean Intellectual Property Office for Korean Application No. 10-2004-0088999 on Feb. 17, 2006.

* cited by examiner

METHODS OF OPERATING MAGNETIC RANDOM ACCESS MEMORY DEVICES INCLUDING HEAT-GENERATING STRUCTURES

RELATED APPLICATION

This application claims the benefit of priority as a continuation-in-part application of U.S. patent application Ser. No. 10/795,600, filed Mar. 8, 2004 now U.S. Pat. No. 7,092,283, which claims the benefit of priority from Korean Application No. P2003-0067530, filed Sep. 29, 2003. This application also claims the benefit of priority as a continuation-in-part application of U.S. patent application Ser. No. 11/201,495 filed Aug. 11, 2005 now U.S. Pat. No. 7,164,598, which claims the benefit of priority from Korean Application No. 2004-63641, filed Aug. 12, 2004. This application also claims the benefit of priority from Korean Patent Application No. 2004-88999, filed Nov. 3, 2004. The disclosures of each of the above referenced U.S. and Korean patent applications are hereby incorporated herein by reference in their entirety.

FIELD OF THE INVENTION

The present invention relates to semiconductor memory devices and, more particularly, to magnetic random access memory devices.

BACKGROUND

A magnetic random access memory (MRAM) is a non-volatile memory device using a magnetoresistance effect to store information. When using the magnetoresistance effect, the resistance of an electrically conductive material is changed using a circumferential magnetic field. An MRAM device may include a plurality of MRAM cells, with each cell having a magnetic tunnel junction (MTJ) and a single transistor.

An MTJ includes multiple thin layers such that electrons may tunnel through a very thin insulating layer sandwiched between two ferromagnetic electrodes when an external electrical signal is applied thereto. A top electrode of the two electrodes is called a free layer, and a bottom electrode is called a pinned layer.

When magnetization directions within the free layer and the pinned layer are arranged parallel with respect to each other, a tunneling current flowing through the MTJ may have a relatively high value. That is, the tunneling resistance may be relatively low. In contrast, when the magnetization directions within the free layer and the pinned layer are arranged anti-parallel with respect to each other, a tunneling current flowing through the MTJ may have a relatively low value. That is, the tunneling resistance may be relatively high.

An MRAM uses magnetization to store information while a conventional memory may use electrical charge. That is, digital data represented as '0' and '1' may be stored differently based on the low resistance state where the magnetization directions of the two electrodes are parallel with respect to each other and the high resistance state where the magnetization directions are anti-parallel with respect to each other.

An anti-ferromagnetic layer (which is referred to as a pinning layer) may be provided adjacent to the pinned layer. The pinning layer may fix the magnetization direction of the pinned layer. That is, the pinned layer adjacent to the pinning layer may have a relatively large switching field, and the magnetization direction of the pinned layer may be fixed in a constant direction when an applied magnetic field is less than the switching field. Thus, data of the MRAM cell may be determined as a function of the magnetization direction within the free layer. The magnetization direction of the free layer may be changed by applying a magnetic field to its circumference or perimeter. To change the magnetization direction of the free layer to a desired direction, conductive layers such as a bit line and a digit line may be formed orthogonal with respect to each other above and below the MTJ. Current may flow through each conductive layer so that a magnetic field generated therefrom may be used to change the magnetization direction of the free layer.

Most MTJs have a rectangular or elliptical shape when seen from a plan view so that magnetic spins within the free layer are in a stable state when they are parallel to the longitudinal direction of the free layer.

An integrated circuit MRAM device may include a plurality of MTJs. The MTJs may have non-uniform switching characteristics depending on a fabrication process used. In this case, external magnetic fields used to store desired data within different MTJs may be different. Accordingly, non-uniform switching characteristics of different MTJs may reduce a write margin for an MRAM device. In particular, when sizes of MTJs are reduced to increase integration density, a write margin may be significantly reduced. In other words, during a write operation to selectively store desired data in one of the MTJs, undesired data may be written in non-selected MTJs that share a bit line and/or a digit line shared with the selected MTJ. That is, according to conventional writing methods, a write disturbance may occur such that undesired data may be stored in non-selected MTJs during an operation to store data in the selected MTJ.

Furthermore, a conventional MRAM cell may have a digit line formed adjacent an MTJ as described above. In general, the digit line may be formed below the MTJ, and the MTJ may have a bottom electrode overlapping the digit line. In this case, the bottom electrode may be electrically connected to a drain region of an access transistor below the digit line. Thus, the bottom electrode may extend in a horizontal direction (parallel with respect to a surface of the substrate) to be in contact with a contact plug on the drain region. Accordingly, reducing an area of the MRAM cell may be difficult due to the presence of the digit line.

MRAM devices have been proposed which are suitable for application of a spin injection mechanism to reduce write disturbance and to increase integration density. For example, MRAM devices using the spin injection mechanism are discussed in U.S. Pat. No. 6,130,814 entitled "Current-Induced Magnetic Switching Device And Memory Including The Same" to Sun. Other MRAM devices using the spin injection mechanism are discussed in U.S. Pat. No. 6,603,677 entitled "Three-Layered Stacked Magnetic Spin Polarization Device With Memory" to Redon et al. The disclosures of U.S. Pat. Nos. 6,130,814 and 6,603,677 are hereby incorporated herein in their entirety by reference.

To switch a selected MRAM cell using the spin injection mechanism, the write current density may be greater than a critical current density. In this case, the access transistor should have the current drivability sufficient to generate a write current greater than the critical current density. That is, when the selected MRAM cell is programmed using the spin injection mechanism, it may be difficult to scale down the access transistors.

An MRAM device capable of extending a write margin by heating the MTJ is discussed in U.S. Pat. No. 6,603,678 B2 entitled "Thermally-Assisted Switching of Magnetic Memory Elements" to Nickel et al. the disclosure of which is hereby incorporated herein in its entirety by reference The MRAM device according to Nickel et al. has a plurality of parallel word lines, a plurality of parallel bit lines crossing above the word lines, a plurality of MTJ cells interposed between the word lines and the bit lines, and heating interconnections diagonally formed above the bit lines. The heating interconnections are formed of metal layers which are electrically insulated from the bit lines.

SUMMARY

According to embodiments of the present invention, methods may be provided for operating a magnetic random access memory (MRAM) device including a magnetic tunnel junction structure and a heat generating layer on the magnetic tunnel junction structure. A write current may be provided through the magnetic tunnel junction structure and through the heat generating layer. Moreover, the write current may have a magnitude sufficient to change a program state of the magnetic tunnel junction structure.

The heat generating layer may include at least one of an aluminum oxide ($Al_2O_3$) layer, an undoped silicon (Si) layer, a silicon carbide (SiC) layer, a silicon oxide ($SiO_2$) layer, a silicon oxynitride (SiON) layer, and/or a chalcogenide layer. The heat generating layer may have a thickness of less than about 30 Å (Angstroms).

The magnetic tunnel junction structure and the heat generating layer may be electrically connected in series between a bit line and a memory cell access transistor. The heat generating layer may be electrically connected between the magnetic tunnel junction structure and the memory cell access transistor, or the heat generating layer may be electrically connected between the magnetic tunnel junction structure and the bit line.

The magnetic random access memory device may also include a conductive plug that is electrically connected between the magnetic tunnel junction structure and the memory cell access transistor, and the magnetic tunnel junction structure and the heat generating layer may be electrically connected in series between the conductive plug and the bit line. Moreover, a contact area between the conductive plug and the heat generating layer may be less than a contact area between the heat generating layer and the magnetic tunnel junction structure.

In alternative embodiments, the magnetic random access memory may include a conductive plug that is electrically connected between the magnetic tunnel junction structure and the bit line, and the magnetic tunnel junction structure and the heat generating layer may be electrically connected in series between the conductive plug and the memory cell access transistor. Moreover, a contact area between the conductive plug and the heat generating layer may be less than a contact area between the heat generating layer and the magnetic tunnel junction structure.

In addition, the write current may have a magnitude sufficient to generate heat at the heat generating layer to thereby heat the magnetic tunnel junction structure. Moreover, providing the write current may include providing a first write current in a first direction through the magnetic tunnel junction structure and through the heat generating layer wherein the first write current has a magnitude sufficient to change a program state of the magnetic tunnel junction structure to a first program state. Providing the write current may also include providing a second write current in a second direction through the magnetic tunnel junction structure and through the heat generating layer wherein the second write current has a magnitude sufficient to change a program state of the magnetic tunnel junction structure to a second program state. Moreover, the first and second directions may be different, and the first and second program states may be different.

In addition, a read signal may be provided through the magnetic tunnel junction structure and through the heat generating layer, and a magnitude of the read signal may be insufficient to change a program state of the magnetic tunnel junction structure. A program state of the magnetic tunnel junction structure may be determined responsive to the read signal.

The magnetic random access memory device may also include a bit line and a memory cell access transistor, and the magnetic tunnel junction structure and the heat generating layer may be electrically connected in series between the memory cell access transistor and the bit line. Moreover, providing the write current may include turning on the memory cell access transistor. In addition, a bit line write signal may be applied to the bit line while turning on the memory cell access transistor to thereby generate the write current through the magnetic tunnel junction structure and the heat generating layer.

According to additional embodiments of the present invention, a magnetic random access memory (MRAM) device may include a memory cell access transistor on a substrate, an insulating layer on the memory cell access transistor and on the substrate, and a bit line on the insulating layer such that the insulating layer is between the bit line and the substrate. Moreover, a memory element may include a magnetic tunnel junction structure and a heat generating layer electrically connected in series between the bit line and a source/drain region of the memory cell access transistor. Moreover, a controller may be electrically connected to the bit line and the memory cell access transistor. The controller may be configured to provide a write current between the bit line and the source/drain region of the memory cell access transistor through the magnetic tunnel junction structure and through the heat generating layer, and the write current may have a magnitude sufficient to change a program state of the magnetic tunnel junction structure. In addition, the write current may have a magnitude sufficient to generate heat at the heat generating layer to thereby heat the magnetic tunnel junction structure.

The heat generating layer may include at least one of an aluminum oxide ($Al_2O_3$) layer, an undoped silicon (Si) layer, a silicon carbide (SiC) layer, a silicon oxide ($SiO_2$) layer, a silicon oxynitride (SiON) layer, and/or a chalcogenide layer. Moreover, the heat generating layer may have a thickness of less than about 30 Å (Angstroms). The heat generating layer may be electrically connected between the magnetic tunnel junction structure and the memory cell access transistor, or the heat generating layer may be electrically connected between the magnetic tunnel junction structure and the bit line.

In addition, a conductive plug may be electrically connected between the magnetic tunnel junction structure and the memory cell access transistor, and the magnetic tunnel junction structure and the heat generating layer may be electrically connected in series between the conductive plug and the bit line. Moreover, a contact area between the conductive plug and the heat generating layer may be less than a contact area between the heat generating layer and the magnetic tunnel junction structure.

In alternative embodiments, a conductive plug may be electrically connected between the magnetic tunnel junction structure and the bit line, and the magnetic tunnel junction structure and the heat generating layer may be electrically connected in series between the conductive plug and the memory cell access transistor. A contact area between the conductive plug and the heat generating layer may be less than a contact area between the heat generating layer and the magnetic tunnel junction structure.

The write current may have a magnitude sufficient to generate heat at the heat generating layer to thereby heat the magnetic tunnel junction structure.

The controller may be further configured to provide a first write current in a first direction through the magnetic tunnel junction structure and through the heat generating layer wherein the first write current has a magnitude sufficient to change a program state of the magnetic tunnel junction structure to a first program state. The controller may also be configured to provide a second write current in a second direction through the magnetic tunnel junction structure and through the heat generating layer, and the second write current may have a magnitude sufficient to change a program state of the magnetic tunnel junction structure to a second program state. The first and second directions may be different, and the first and second program states may be different.

In addition, the controller may be configured to provide a read signal through the magnetic tunnel junction structure and through the heat generating layer, and a magnitude of the read signal may be insufficient to change a program state of the magnetic tunnel junction structure. The controller may thus be configured to determine a program state of the magnetic tunnel junction structure responsive to the read signal.

According to embodiments of the present invention, a write current may be reduced without significantly reducing an integration density of an MRAM device.

According to some embodiments of the present invention, methods may be provided for programming and reading an MRAM device including heat-generating structures. In particular, a write current may be applied to an MTJ and at least one heat-generating structure may be formed on or beneath the MTJ. The write current may be a positive write current flowing toward a pinned layer of the MTJ from a free layer of the MTJ or a negative write current flowing toward the free layer of the MTJ from the pinned layer of the MTJ. The MTJ may be heated by heat generated when the write current flows in the heat-generating structure while magnetic polarizations within the free layer are arranged parallel or anti-parallel with respect to magnetic polarizations within the pinned layer using the write current.

Applying the write current may include turning on a switching device electrically connected to one terminal of the MTJ, and applying a bit line writing signal to the bit line electrically connected to the other terminal of the MTJ. In this case, the positive write current or the negative write current flows through the MTJ and the switching device connected to the MTJ.

The heat-generating structure may include at least one selected from a group consisting of an aluminum oxide layer ($Al_2O_3$), an undoped silicon layer, a silicon carbide layer (SiC), a silicon oxide layer, a silicon oxynitride layer (SiON), and/or a chalcogenide layer. With a chalcogenide layer, the chalcogenide layer may be a compound layer including germanium, stibium, and tellurium, (i.e., a GST layer). The heat-generating structure may have a thickness of less than about 30 Å (Angstroms) to reduce degradation of a tunneling effect of charges.

The heat-generating structure may be between the MTJ and a lower interlayer-insulating layer. In this case, the lower interlayer-insulating layer may further include an MTJ contact plug that penetrates the lower interlayer-insulating layer to connect to the switching device. At least a part of the heat-generating structure may cover the MTJ contact plug. In addition, the heat-generating structure may be in contact with an entire bottom surface of the MTJ. A contact area between the heat-generating structure and the MTJ contact plug may be smaller than the bottom surface of the MTJ. As a result, the MTJ may be electrically connected to the switching device via the heat-generating structure and the MTJ contact plug.

Alternatively, the heat-generating structure may be formed on the MTJ. In this case, a bit line contact plug may be further included between the bit line and the heat-generating structure. In addition, the heat-generating structure may be in contact with an entire top surface of the MTJ. A contact area between the heat-generating structure and the bit line may be smaller than the top surface of the MTJ. As a result, the bit line may be electrically connected to the MTJ via the heat-generating structure and the bit line contact plug.

The MTJ may include a pinning layer, a pinned layer, a tunneling insulating layer, and a free layer. The free layer may be a synthetic anti-ferromagnetic (SAF) layer including a lower ferromagnetic layer, an upper ferromagnetic layer, and an anti-ferromagnetic spacer layer therebetween.

According to other embodiments of the present invention, methods may be provided to program and read an MRAM device. The MRAM device may include a switching device on a predetermined region of a semiconductor substrate, a lower interlayer-insulating layer covering the switching device and the semiconductor substrate, an MTJ formed on the lower interlayer-insulating layer and electrically connected to the switching device, an upper interlayer-insulating layer covering the MTJ and the lower interlayer-insulating layer, a bit line formed on the upper interlayer-insulating layer and electrically connected to the MTJ, and at least one heat-generating structure on or beneath the MTJ. The programming method may include turning on the switching device. A write current may flow through the MTJ and the heat-generating structure by applying a bit line writing signal to the bit line. The write current may be a positive write current flowing toward a pinned layer of the MTJ from a free layer of the MTJ or a negative write current flowing toward the free layer of the MTJ from the pinned layer of the MTJ. The MTJ may be heated by heat generated when the write current flows in the heat-generating structure while magnetic polarizations within the free layer are arranged parallel or anti-parallel with respect to magnetic polarizations within the pinned layer using the write current.

The reading method may include applying a read voltage to both terminals of the MTJ and sensing an amount of read current flowing through the MTJ. The read current may be smaller than the write current.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
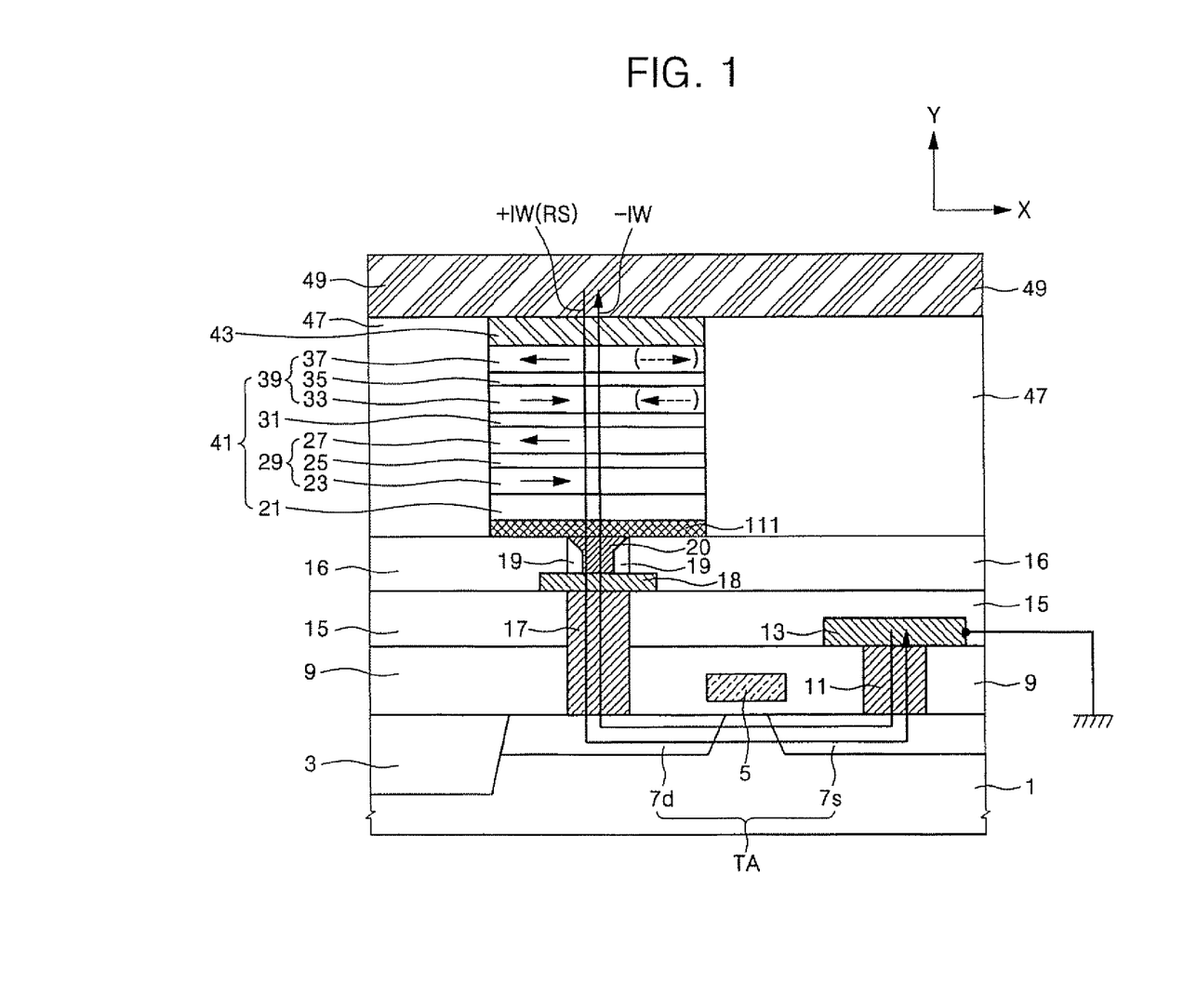
FIGS. 1 and 4 are cross-sectional views of MRAM devices with heat-generating structures suitable for the application of programming methods according to embodiments of the present invention.

FIG. 1 is a cross-sectional view of an MRAM device including a heat-generating structure suitable for application of programming methods according to embodiments of the present invention. Referring to FIG. 1, the MRAM device may include an isolation layer 3, a drain region 7d, a source region 7s, and a channel region (between the source and drain regions) in an integrated circuit substrate 1. The channel region is between the drain region 7d and the source region 7s, and an insulated gate electrode 5 may be formed above the channel region. The gate electrode 5 may be a portion of an extended word line. As a result, a switching device (i.e., an access transistor TA) including the drain region 7d, the source region 7s, the channel region, and the gate electrode 5 may be provided on the substrate 1.

A first interlayer-insulating layer 9 may be formed on the substrate including the access transistor TA. Portions of the source region 7s may be exposed by a source contact hole penetrating the first interlayer-insulating layer 9, and the source contact hole may be filled with a source contact plug 11. The source contact plug 11 may be covered by a source line 13. Consequently, the source line 13 may be electrically connected to the source region 7s via the source contact plug 11.

A second interlayer-insulating layer 15 may be formed on the substrate including the source line 13. The drain region 7d may be exposed by a drain contact hole penetrating the first interlayer-insulating layer 9 and the second interlayer-insulating layer 15, and the drain contact hole may be filled with a drain contact plug 17. The drain contact plug 17 may be covered by a drain pad 18, or the drain pad 18 may be omitted. The drain pad 18 may be electrically connected to the drain region 7d via the drain contact plug 17.

The semiconductor substrate including the drain pad 18 may be covered by a third interlayer-insulating layer 16. The first to third interlayer-insulating layers 9, 15 and 16 may provide a lower interlayer-insulating layer. The drain pad 18 may be exposed by an MTJ contact hole penetrating the third interlayer-insulating layer 16. The MTJ contact hole may expose the drain contact plug 17 if the drain pad 18 is omitted. Furthermore, the MTJ contact hole may directly expose the drain region 7d if both the drain pad 18 and the drain contact plug 17 are omitted.

The MTJ contact hole may be filled with an MTJ contact plug 20. An insulating spacer(s) 19 may be formed on a sidewall(s) of the MTJ contact hole. The insulating spacer(s) 19 may further reduce an effective cross-sectional area of the MTJ contact plug 20. The MTJ contact plug 20 may thus be electrically connected to the drain region 7d.

The MTJ contact plug 20 may be covered by an MTJ 41. A heat-generating structure 111 may be formed between the MTJ 41 and the MTJ contact plug 20. At least a part of the heat-generating structure 111 may cover the MTJ contact plug 20. In addition, the heat-generating structure 111 may be in contact with substantially an entire bottom surface of the MTJ 41. Consequently, the contact area between the MTJ contact plug 20 and the heat-generating structure 111 may be less than a surface area of the bottom surface of the MTJ 41.

The heat-generating structure 111 may be at least one selected from a group consisting of an aluminum oxide layer ($Al_2O_3$), an undoped silicon layer, a silicon carbide layer (SiC), a silicon oxide layer, a silicon oxynitride layer (SiON), and/or a chalcogenide layer. If the heat-generating structure includes a chalogenide layer, the chalcogenide layer may be a compound layer including germanium, stibium, and tellurium (i.e., a GST layer). The heat-generating structure 111 may have a thickness of less than about 30 Å (Angstroms) to reduce degradation of a tunneling effect of charges.

The MTJ 41 may include a pinned layer 29, a free layer 39, and a tunneling insulating layer 31 therebetween. Furthermore, the MTJ 41 may include a pinning layer 21 in direct contact with the pinned layer 29. As shown in FIG. 1, the pinning layer 21 may be stacked in contact with the heat-generating structure 111, and the pinned layer 29, the tunneling insulating layer 31, and the free layer 39 may be sequentially stacked on the pinning layer 21. Respective layers 21, 29, 31, and 39 of the MTJ 41 may be stacked in various orders other than that shown in FIG. 1.

The free layer 39 may, for example, be a single layer of a ferromagnetic material, or a synthetic anti-ferromagnetic (SAF) layer having a bottom ferromagnetic layer 33, an anti-ferromagnetic coupling spacer layer 35, and a top ferromagnetic layer 37 which are sequentially stacked as shown in FIG. 1. The pinned layer 29 may, for example, be a single layer of a ferromagnetic material, or a synthetic anti-ferromagnetic (SAF) layer having a bottom ferromagnetic layer 23, an anti-ferromagnetic coupling spacer layer 25, and a top ferromagnetic layer 27 which are sequentially stacked as shown in FIG. 1.

A top electrode 43 may be formed on the MTJ 41. The top electrode 43 may be, for example, a titanium nitride layer. The structure including the top electrode 43 may be covered by an upper interlayer-insulating layer 47, and the top surface of the top electrode 43 may be exposed through the layer 47. A bit line 49 may be formed on the upper interlayer-insulating layer 47 and the top electrode 43. The bit line 49 may be electrically connected to the MTJ 41 via the top electrode 43. The MTJ 41 may have a rectangular or elliptical shape having a length and a width smaller than the length when seen from a plan view (such that a direction of the length and a direction of the width are parallel with respect to a surface of the substrate).

Hereinafter, writing (programming) methods according to embodiments of the present invention will be described with reference to FIG. 1. Referring to FIG. 1, a word line signal may be applied to the word line (i.e., a gate electrode 5) of the access transistor TA while a bit line writing signal is applied to the bit line 49. The word line signal may be a voltage pulse signal having a word line voltage higher than a threshold voltage of the access transistor TA for a predetermined time. As a result, the access transistor TA connected to the word line may be turned on while the word line voltage is applied. In addition, the bit line writing signal may be a current pulse signal forcing current to the bit line while the word line signal is applied. As a result, a write current flows through the MTJ 41 and the access transistor TA serially connected to the MTJ 41. For example, when the word line signal and the bit line writing signal are applied to the word line 5 and the bit line 49, respectively, the write current may flow through the MTJ 41 connected to the source line 13 and the bit line 49.

The write current may be a positive write current +IW which flows to the pinned layer 29 from the free layer 39 in the selected MTJ 41, or a negative write current −IW which flows to the selected free layer 39 from the selected pinned layer 29. That is, according to embodiments of the present embodiments, the positive write current +IW may flow in negative Y-axis direction within the selected MTJ 41 as shown in FIG. 1, and the negative write current −IW may flow in a positive Y-axis direction as shown in FIG. 1. That is, electrons flow to the positive Y-axis direction while the positive write current +IW flows, and in the negative Y-axis direction while the negative write current −IW flows.

When the source line 13 is grounded during a programming operation (write operation), the positive write current +IW may be generated by applying a positive program voltage to the selected bit line. Similarly, when the source line 13 is grounded during the programming operation (write operation), the negative write current −IW may be generated by applying a negative program voltage to the selected bit line.

When the positive write current +IW flows through the selected MTJ 41, most electrons passing through the pinned layer 29 may be changed to have spins of the same magnetization direction as that of fixed magnetic polarizations within the pinned layer 29. For example, when a majority of magnetic polarizations within the pinned layer 29 have up-spins, most electrons passing through the pinned layer 29 may be changed to have up-spins. In particular, when the pinned layer 29 is an SAF layer as described above, most electrons may be changed to have spins of the same magnetization direction as the top ferromagnetic layer 27 of the SAF pinned layer.

The up-spin electrons may pass through the tunneling insulating layer 31 to reach the free layer 39. The number of up-spin electrons reaching the free layer 39 may be proportional to the current density of the positive write current +IW. As a result, when the current density of the positive write current increases, the free layer 39 may have a majority of magnetic polarizations parallel with respect to the magnetic polarizations fixed within the pinned layer 29 regardless of their initial magnetization direction because of the up-spin electrons injected into the free layer 39. When the free layer 39 is an SAF layer as described above, the positive write current +IW may make magnetic polarizations within the bottom ferromagnetic layer 33 of the SAF free layer parallel with respect to magnetic polarizations fixed within the pinned layer 29. In addition, when both of the pinned layer 29 and the free layer 39 are SAF layers as shown in FIG. 1, the positive write current +IW makes magnetic polarizations within the bottom ferromagnetic layer 33 of the SAF free layer parallel with respect to magnetic polarizations fixed within the top ferromagnetic layer 27 of the SAF pinned layer. Consequently, when the current density of the positive write current is higher than a critical current density, the MTJ 41 may be switched to have a relatively low resistance value.

Meanwhile, when the negative write current −IW flows through the MTJ 41, up-spin electrons and down-spin electrons are injected into the free layer 39. When a majority of magnetic polarizations fixed within the pinned layer 29 have up-spins, only the up-spin electrons injected into the free layer 39 pass through the tunneling insulating layer 31 to reach the pinned layer 29, and the down-spin electrons injected into the free layer 39 may accumulate within the free layer 39. The number of each of the up-spin electrons and the down-spin electrons is also proportional to the current density of the negative write current −IW. Accordingly, when the current density of the negative write current increases, the free layer 39 may have majority magnetic polarizations antiparallel with respect to the magnetization direction of the pinned layer 29 regardless of their initial magnetization direction. Consequently, when the current density of the negative write current is higher than a critical current density, the MTJ 41 may be switched to have a relatively high resistance value.

To switch the MRAM 41 using the spin injection mechanism as described above, the density of the write current should be higher than the critical current density. More particularly, the access transistor TA should be capable of driving sufficient current to generate a write current higher than the critical current density. That is, when an MRAM cell is programmed using the spin injection mechanism, it may be difficult to scale down the access transistor TA while maintaining sufficient current drive, and increased integration densities of the MRAM device may thus be difficult to obtain. Accordingly, to provide writing methods (programming methods) capable of reducing the density of the write current used to successfully switch a selected MRAM device, embodiments of the present invention may include providing the heat-generating structure 111 below the MTJ 41 to heat the MTJ 41.

The write currents +IW and −IW flow through the heat-generating structure 111 provided between the MTJ 41 and the MTJ contact plug 20. The write currents +IW and −IW may have a highest current density at an interface between the MTJ contact plug 20 and the heat-generating structure 111. This may be because the heat-generating structure 111 has a relatively high specific resistance compared to the pinning layer 21, the pinned layer 29, and the free layer 39, and because a contact area between the MTJ contact plug 20 and the heat-generating structure 111 is smaller than a planar area (i.e., a surface area parallel with respect to a surface area of the substrate) of the MTJ 41. Accordingly, the heat-generating structure 111 may be heated by the write currents +IW and −IW to generate Joule heat.

Heat generated from the heat-generating structure 111 may heat the MTJ 41. As a result, magnetic spins within the free layer 39 may be successfully switched with a write current density that may be lower than that required at a room temperature. More particularly, when the word line signal and the bit line writing signal are applied to the word line 5 and the bit line 49, respectively, a write current may flow through the MTJ 41 connected to the source line 13 and the bit line 49. At the same time, the MTJ 41 may be heated by the heat generated from the heat-generating structure 111. The heated MTJ 41 may thus be more readily switched than at a room temperature. For example, when the positive write current +IW flows in the heated MTJ 41, magnetic polarizations within the heated free layer 39 may be arranged parallel with respect to magnetic polarizations within the pinned layer 29 even when the positive write current +IW is at a relatively low level. Similarly, when the negative write current −IW flows in the heated MTJ 41, magnetic polarizations within the heated free layer 39 may be arranged antiparallel with respect to magnetic polarizations within the pinned layer 29 even if the negative write current −IW is at a relatively a low level.

As a result, the heat generated from the heat-generating structure 111 may reduce a minimum write current required to successfully switch the MTJ 41. That is, the critical current density may be reduced.

According to embodiments of the present invention, the MTJ 41 may be in direct contact with the heat-generating structure 111. As a result, an MRAM device according to embodiments of the present invention may have a relatively high heating efficiency. In addition, the write currents +IW and −IW may flow through only the selected cell during the write operation. Consequently, writing selectivity and writing efficiency of the MRAM device may be enhanced in accordance with embodiments of the present invention.

A method of reading data stored in the MRAM device may include applying a read voltage to both terminals of the MTJ 41 of the MRAM device. For example, to read the data stored in the MRAM device, a word line voltage may be applied to the word line to turn on the access transistor TA connected to the word line, and a ground voltage and the read voltage may be applied to the source line 13 and the bit line 49, respectively. As a result, a read current may flow through the MTJ 41 of the MRAM device, and data of the MRAM cell may be discriminated as logic "0" or logic "1" in response to a magnitude of the read current. The read voltage should be sufficiently low so that a resulting read current is less than a minimum write current. The read current (also referred to as a read signal RS) may follow the path of the write current designated by the reference +IW in FIG. 1.

Figure 2:
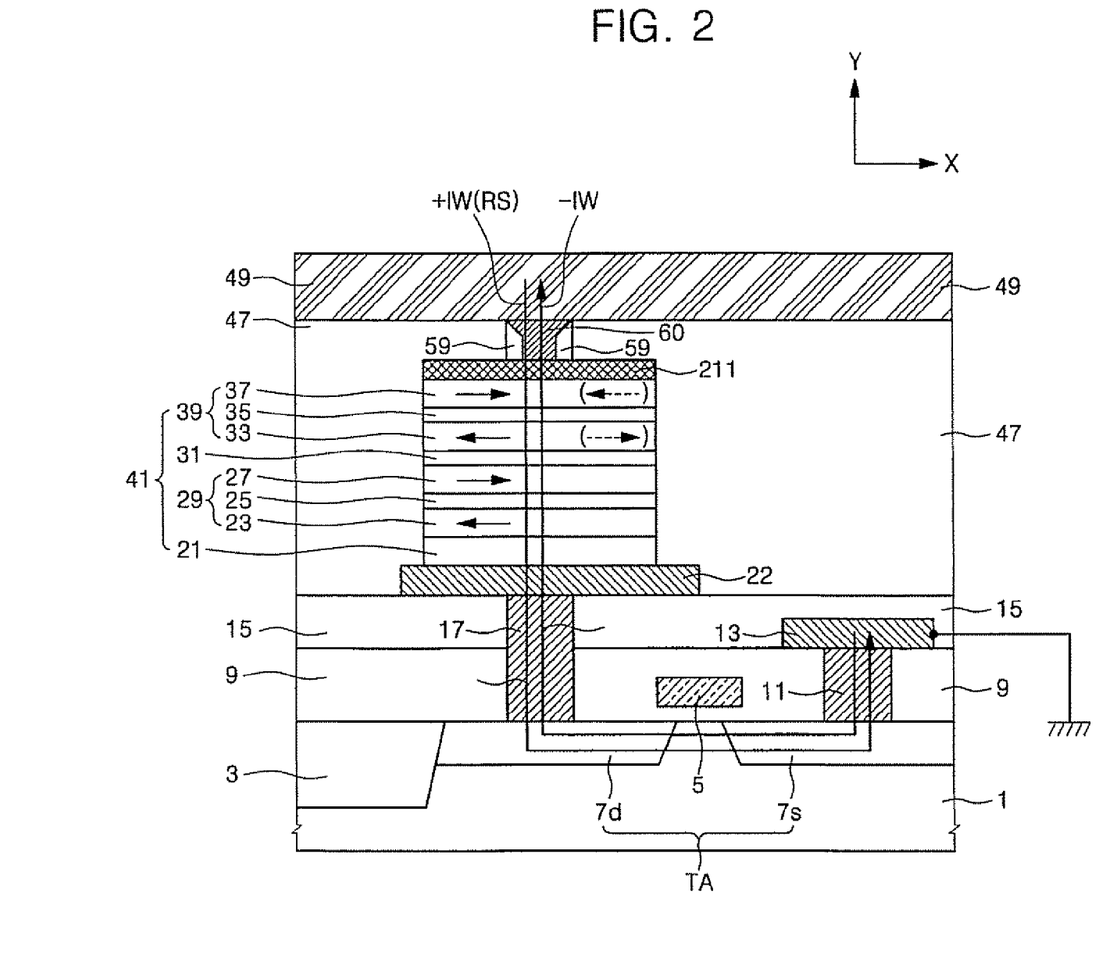
FIGS. 2 and 5 are cross-sectional views of other MRAM devices with heat-generating structures suitable for the application of programming methods according to embodiments of the present invention.

FIG. 2 is a cross-sectional view of another MRAM device including a heat-generating structure suitable for the application of programming methods according to more embodiments of the present invention. Referring to FIG. 2, the MRAM device the may include a switching device (i.e., access transistor TA) having a drain region 7d, a source region 7s, and a gate electrode 5, as described above with reference to FIG. 1. Moreover, the switching device (i.e., access transistor) may be provided in an active region of the substrate surrounded by an isolation layer 3. For simplicity of description, the following description will focus on aspects of the structure of FIG. 2 that are different than the structure shown in FIG. 1.

A first interlayer-insulating layer 9, a second interlayer-insulating layer 15, a source contact plug 11, a source line 13, and a drain contact plug 17 may be formed on the structure including the access transistor TA as in the embodiments shown in FIG. 1. The drain contact plug 17 may be covered by a bottom electrode 22. The bottom electrode 22 may thus be electrically connected to the drain region 7d via the drain contact plug 17.

An MTJ 41 may be formed on the bottom electrode 22. Moreover, a heat-generating structure 211 may be formed on the MTJ 41 as shown in FIG. 2 instead of the heat-generating structure 111 formed below the MTJ 41. In addition, the heat-generating structure 211 may be in contact with an entire top surface of the MTJ 41. The structure including the heat-generating structure 211 may be covered by an upper interlayer-insulating layer 47. A bit line 49 may be formed on the upper interlayer-insulating layer 47. A bit line contact hole penetrating the upper interlayer-insulating layer 47 may be provided between the bit line 49 and the heat-generating structure 211. The bit line contact hole may be filled with a bit line contact plug 60. An insulating spacer(s) 59 may be formed on a sidewall(s) of the bit line contact hole. The insulating spacer(s) 50 may further decrease an effective cross-sectional area of the bit line contact plug 60. The bit line 49 may thus be electrically connected to the heat-generating structure 211 via the bit line contact plug 60. In addition, a contact area between the heat-generating structure 211 and the bit line contact plug 60 may be smaller than a top surface of the MTJ 41 (i.e., a top surface area of the MTJ 41 parallel with respect to a surface of the substrate 1). The heat-generating structure 211 may be at least one selected from a group consisting of an aluminum oxide layer ($Al_2O_3$), an undoped silicon layer, a silicon carbide layer (SiC), a silicon oxide layer, a silicon oxynitride layer (SiON), and/or a chalcogenide layer. If the heat-generating structure 211 is a chalcogenide layer, the chalcogenide layer may be a compound layer including germanium, stibium, and tellurium (i.e., a GST layer). The heat-generating structure 211 may have a thickness of less than about 30 Å (Angstroms) to reduce degradation of a tunneling effect of charges.

In the MRAM device of FIG. 2, the heat-generating structure 211 may be formed on the MTJ 41, and then the MTJ 41 may be heated using the heat generating structure 211 to provide writing methods (programming methods) so that the write current density used to successfully switch the MRAM device may be reduced. Heat generated by the heat-generating structure 211 may reduce a minimum write current required to successfully switch the MTJ 41. That is, a critical current density may be reduced.

Figure 3:
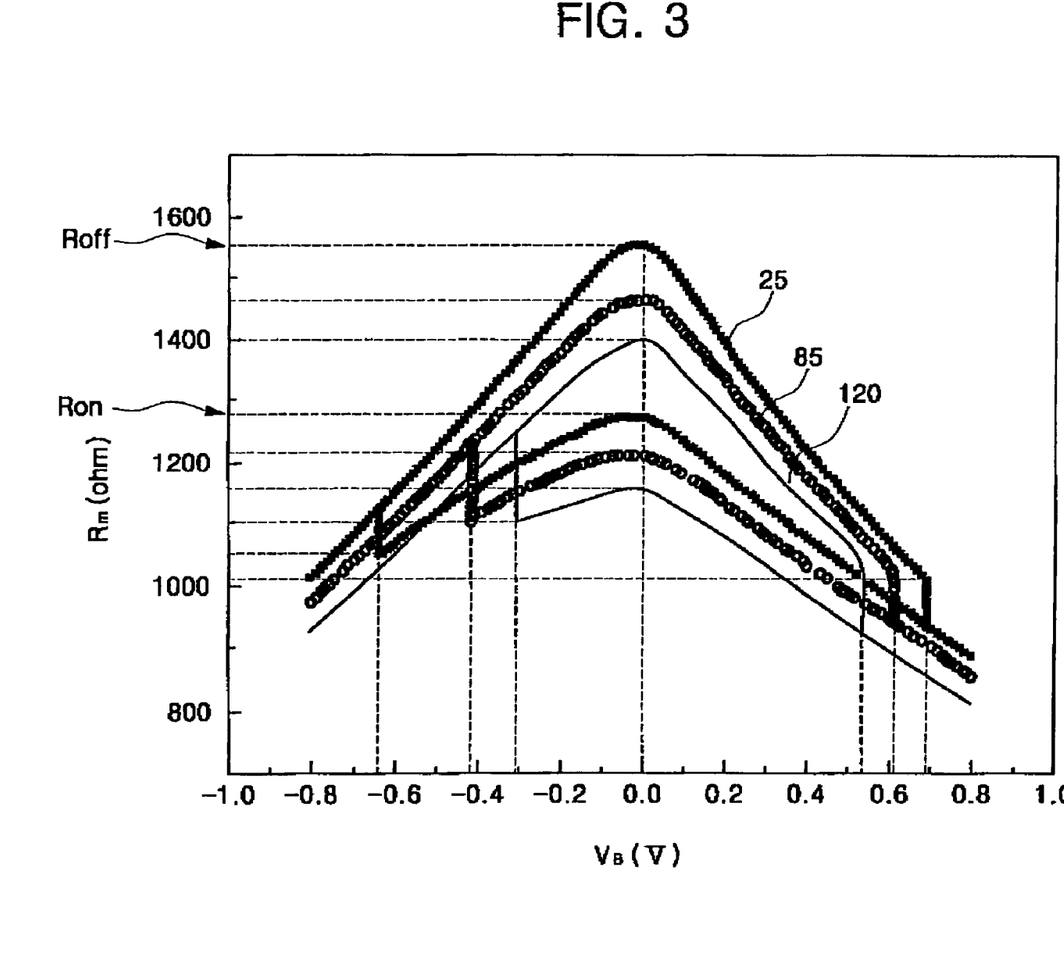
FIG. 3 is a graph illustrating a switching loop of an MRAM device to which a writing method according to embodiments of the present invention is applied.

FIG. 3 is a graph illustrating a switching loop of an MRAM device to which a writing method according to embodiments of the present invention is applied. Referring to FIG. 3, a horizontal axis indicates a bit line voltage $V_B$ applied to the bit line of the MRAM device to generate a write current for the MTJ of the MRAM device in units of volts (V). A vertical axis indicates an electrical resistance Rm of the MTJ depending on the bit line voltage $V_B$ in units of ohm.

For the purpose of description, it is assumed that the MTJ has a logical value of zero when magnetic polarizations within a free layer are parallel with respect to magnetic polarizations within a pinned layer. In addition, it is assumed that the MTJ has a logical value of one when magnetic polarizations within the free layer are antiparallel (non-parallel) with respect to magnetic polarizations within the pinned layer.

A curve 25 of FIG. 3 indicates a switching loop of an MTJ measured at 25° C. (degrees C.) (i.e., a room temperature), a curve 85 of FIG. 3 indicates a switching loop of an MTJ heated at 85° C. (degrees C.), and a curve 120 of FIG. 3 indicates a switching loop of the MTJ heated at 120° C. (degrees C.).

Referring to the curve 25 of FIG. 3, the MTJ may have an off-resistance $R_{off}$ of about 1550 ohm at a low bit line voltage $V_B$ of about 0 volts when the MTJ has a logical value of one. When the bit line voltage $V_B$ increases toward a positive direction to generate a positive write current, the resistance Rm of the MTJ decreases along the curve 25. When the bit line voltage $V_B$ reaches about +0.7 volts, the MTJ may have a resistance of about 1020 ohm and may then switch. That is, the MTJ may be switched to have a logical value of zero. A resistance Rm of the MTJ having the logical value of zero may change along the curve 25 at the positive bit line voltage $+V_B$. That is, the MTJ having the logical value of zero may have an on-resistance $R_{on}$ of about 1280 ohm at a low bit line voltage $V_B$ of about 0 volts. The MTJ may maintain the logical value of zero even when a bit line voltage $V_B$ higher than +0.7 volts is applied to the MTJ having the logical value of zero.

Subsequently, when a negative bit line voltage $V_B$ is applied to the MTJ having the logical value of zero, the resistance Rm of the MTJ may decrease along the curve 25. When the bit line voltage $V_B$ reaches about −0.65 volts, the MTJ may have a resistance of about 1050 ohm and may then switch to have a logical value of one. A resistance Rm of the MTJ having the logical value of one changes along the curve 25 at the negative bit line voltage $-V_B$. The MTJ having the logical value of one may have an off-resistance $R_{on}$ of about 1550 ohm again at a low bit line voltage $V_B$ of about 0 volts. Meanwhile, the MTJ may maintain the logical value of one even when a bit line voltage $V_B$ higher than −0.65 volts is applied to the MTJ having the logical value of one.

Referring to the curve 85 of FIG. 3, the MTJ may have an off-resistance $R_{off}$ of about 1480 ohm at a low bit line voltage $V_B$ of about 0 volts when the MTJ has a logical value of one. When the bit line voltage $V_B$ increases toward a positive direction and reaches about +0.6 volts to generate a positive write current, the MTJ may have a resistance of about 1020 ohm and may then switch. The MTJ having the logical value of zero may have an on-resistance $R_{on}$ of about 1220 ohm at a low bit line voltage $V_B$ of about 0 volts. Meanwhile, the MTJ may maintain the logical value of zero even when a bit line voltage $V_B$ higher than +0.6 volts is applied to the MTJ having the logical value of zero.

Subsequently, when a negative bit line voltage $-V_B$ is applied to the MTJ having the logical value of zero to reach about −0.4 volts, the MTJ may have a resistance of about 1100 ohm and may then switch to have a logical value of one. The MTJ having the logical value of one may have an off-resistance $R_{off}$ of about 1480 ohm again as described above at the low bit line voltage $V_B$ of about 0 volts. Meanwhile, the MTJ may maintain the logical value of one even when a negative bit line voltage $V_B$ higher than −0.4 volts is applied to the MTJ having the logical value of one.

Referring to the curve 120 of FIG. 3, the MTJ may have an off-resistance $R_{off}$ of about 1400 ohm at a low bit line voltage $V_B$ of about 0 volts when the MTJ has a logical value of one. When the bit line voltage $V_B$ increases toward a positive direction and reaches about +0.52 volts to generate a positive write current, the MTJ may have a resistance of about 1020 ohm and may then switch. The MTJ having the logical value of zero may have an on-resistance $R_{on}$ of about 1150 ohm at a low bit line voltage $V_B$ of about 0 volts. Meanwhile, the MTJ may maintain the logical value of zero even when a bit line voltage $V_B$ higher than +0.52 volts is applied to the MTJ having the logical value of zero.

When a negative bit line voltage $-V_B$ applied to the MTJ having the logical value of zero reaches about −0.3 volts, the MTJ may have a resistance of about 1100 ohm and may then switch to have a logical value of one. The MTJ having the logical value of one may have an off-resistance $R_{off}$ of about 1400 ohm again as described above at a low bit line voltage $V_B$ of about 0 volts. Meanwhile, the MTJ may maintain the logical value of one even when a negative bit line voltage $V_B$ higher than −0.3 volts is applied to the MTJ having the logical value of one.

A method of reading data stored in the MRAM device having measured characteristics of FIG. 3 may include applying a word line voltage to the word line electrically connected to the MRAM device, and applying a read voltage to the bit line electrically connected to the MRAM device.

The read voltage may desirably be a relatively low voltage as close to 0 volts as possible. A relatively low read voltage may be desirable because a difference between the off resistance $R_{off}$ and the on-resistance $R_{on}$ in the MRAM device (i.e. MTJ) may increase as the read voltage (i.e. bit line voltage) gets closer to 0 volts as shown in FIG. 3. That is, a sensing margin of the MRAM device may increase as the read voltage (i.e. bit line voltage) decreases. For example, in the case of the MRAM device having measurement results of FIG. 3, a low bit line voltage of about 0.1 volts to about 0.2 volts may be used as the read voltage. In this case, the difference between the off resistance $R_{off}$ and the on-resistance $R_{on}$ in the MTJ may be at least about 200 ohm, so that a sensing margin of the MRAM device may be increased. As can be seen from the curves 25, 85, and 120 of FIG. 3, the MTJ may be switched at a lower bit line voltage $V_B$ as the heating temperature increases.

According to embodiments of the present invention discussed above, at least one heat-generating structure may be formed on or below the MTJ. A write current that passes through the MTJ may be applied to switch the MTJ using a spin injection mechanism. The write current may cause the heat-generating structure to generate heat, and the MTJ may be heated by heat generated from the heat-generating structure. As a result, a write current used to switch the MTJ may be significantly reduced by increasing a temperature of the MTJ.

Figure 4:
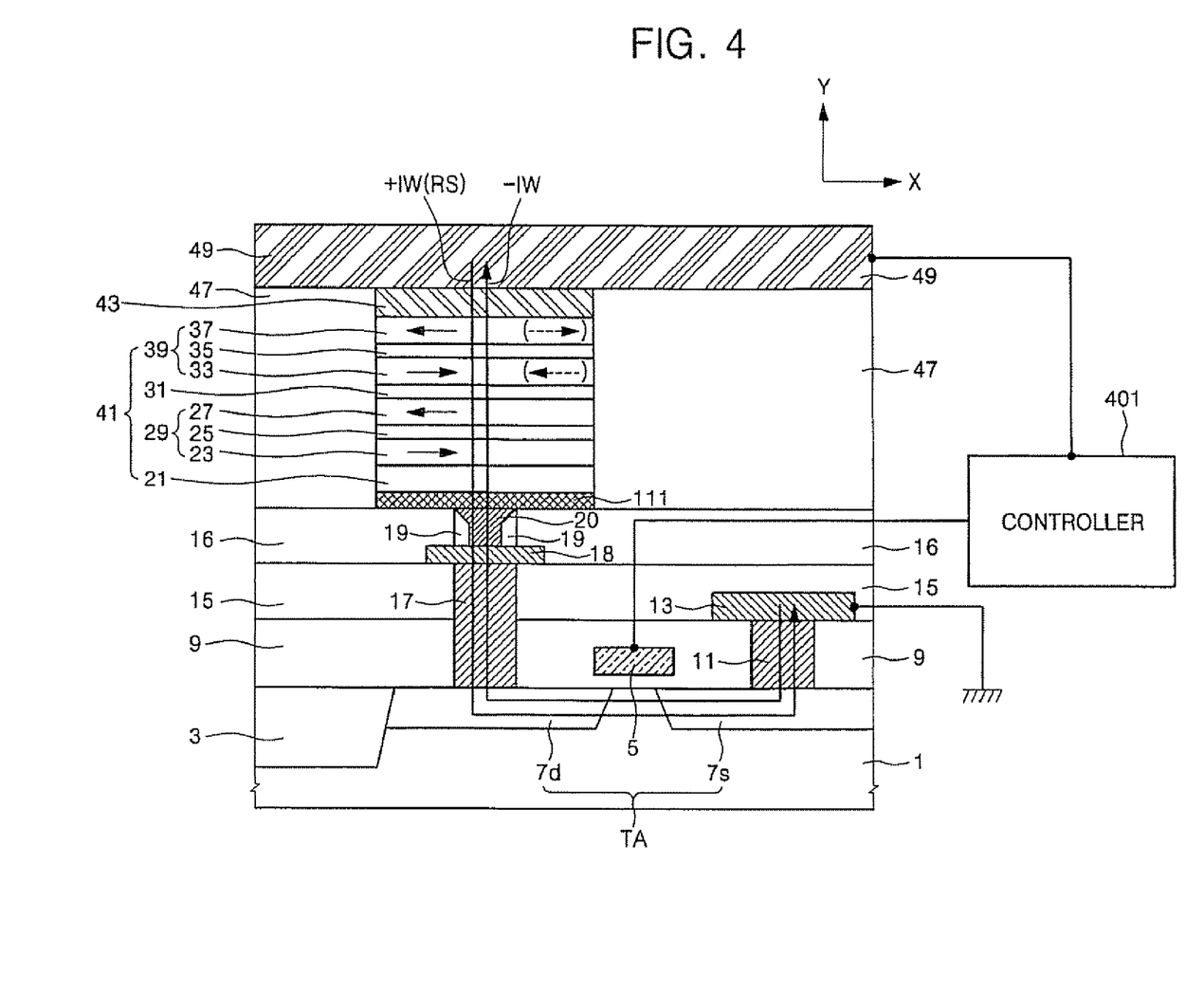

FIG. 4 is another cross-sectional view of the magnetic random access memory device of FIG. 1 illustrated with a controller 401 configured to control operations of the memory device. The controller 401 is shown in block diagram form for purposes of discussion. The controller 401 may be implemented using electronic circuits (such as resistors, transistors, capacitors, etc.) provided on/in portions of the substrate 1 not shown in FIG. 4. Moreover, the controller 401 may be defined to include the memory cell access transistor TA and/or elements thereof. Portions of the memory device of FIG. 4 designated by reference numbers that are also used in FIG. 1 are the same as discussed above with respect to FIG. 1.

The memory cell access transistor TA may be provided on the substrate 1, and the insulating layers 9, 15, 16, and 47 may be provided on the memory cell access transistor TA and on the substrate 1. The bit line 49 may be provided on the insulating layer layers 9, 15, 16, and 47 such that the insulating layers are between the bit line 49 and the substrate 1. Moreover, the magnetic tunnel junction 41 and the heat generating structure 111 may together be referred to as a memory element, and the magnetic tunnel junction 41 and the heat generating layer 111 may be electrically connected in series between the bit line 49 and the source/drain region 7d of the memory cell access transistor TA.

The controller 401 may be electrically connected to the bit line 49 and to the gate 5 of the memory cell access transistor TA, and the source line 13 may be coupled to an electrical ground. The controller may be configured to provide a positive or negative write current (+IW or −IW) between the bit line 49 and the source/drain region 7d of the memory cell access transistor TA through the magnetic tunnel junction structure 41 and through the heat generating structure 111 wherein the write current has a magnitude sufficient to change a program state of the magnetic tunnel junction 41. In greater detail, the positive or negative write current (+IW or −IW) may pass through the bit line 49, the MTJ 41, the memory cell access transistor TA (including drain/source regions 7d and 7s), and the source line 13 (coupled to the electrical ground). More particularly, the write current may have a magnitude sufficient to generate heat at the heat generating layer to thereby heat the magnetic tunnel junction structure.

More particularly, the controller 401 may be configured to provide a first write current (e.g., positive write current +IW) in a first direction through the magnetic tunnel junction 41 and through the heat generating structure 111, and the first write current may have a magnitude sufficient to change a program state of the magnetic tunnel junction 41 to a first program state. The controller 401 may also be configured to provide a second write current (e.g., negative write current −IW) in a second direction through the magnetic tunnel junction 41 and through the heat generating layer 111, and the second write current may have a magnitude sufficient to change a program state of the magnetic tunnel junction 41 to a second program state. Moreover, the first and second directions may be different, and the first and second program states may be different.

The controller may also be configured to provide a read signal RS through the magnetic tunnel junction 41 and through the heat generating layer 111 wherein a magnitude of the read signal is insufficient to change a program state of the magnetic tunnel junction 41. The controller 401 may thus determine a program state of the magnetic tunnel junction structure responsive to the read signal. In greater detail, the read signal RS may pass through the bit line 49, the MTJ 41, the memory cell access transistor TA (including drain/source regions 7d and 7s), and the source line 13 (coupled to the electrical ground).

Figure 5:
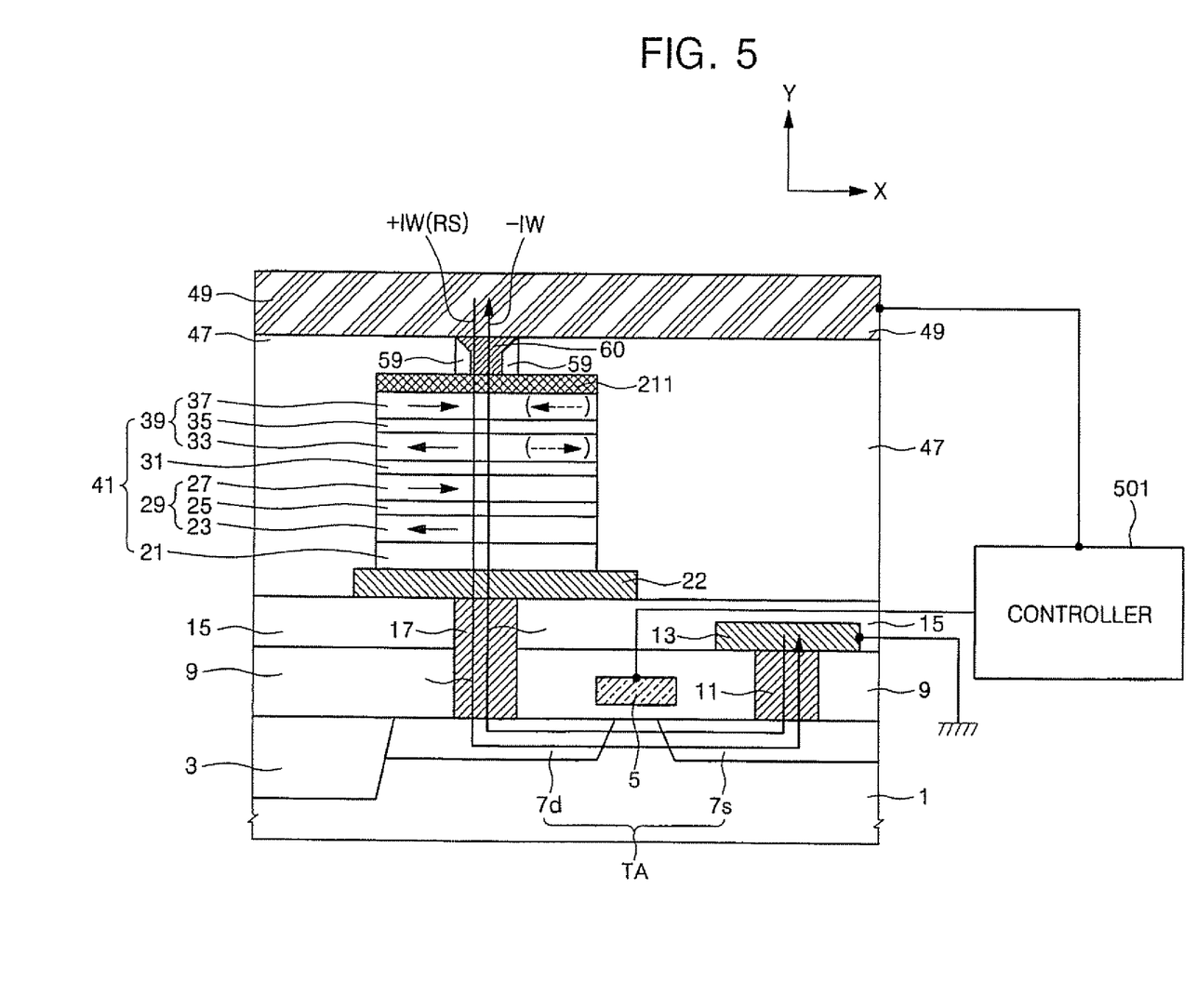

FIG. 5 is another cross-sectional view of the magnetic random access memory device of FIG. 2 illustrated with a controller 501 configured to control operations of the memory device. The controller 501 is shown in block diagram form for purposes of discussion. The controller 501 may be implemented using electronic circuits (such as resistors, transistors, capacitors, etc.) provided on/in portions of the substrate 1 not shown in FIG. 5. Moreover, the controller 501 may be defined to include the memory cell access transistor TA and/or elements thereof. Portions of the memory device of FIG. 5 designated by reference numbers that are also used in FIG. 2 are the same as discussed above with respect to FIG. 2.

The memory cell access transistor TA may be provided on the substrate 1, and the insulating layers 9, 15, and 47 may be provided on the memory cell access transistor TA and on the substrate 1. The bit line 49 may be provided on the insulating layer layers 9, 15, and 47 such that the insulating layers are between the bit line 49 and the substrate 1. Moreover, the magnetic tunnel junction 41 and the heat generating structure 211 may together be referred to as a memory element, and the magnetic tunnel junction 41 and the heat generating layer 211 may be electrically connected in series between the bit line 49 and the source/drain region 7d of the memory cell access transistor TA.

The controller 501 may be electrically connected to the bit line 49 and to the gate 5 of the memory cell access transistor TA, and the source line 13 may be coupled to an electrical ground. The controller may be configured to provide a positive or negative write current (+IW or −IW) between the bit line 49 and the source/drain region 7d of the memory cell access transistor TA through the magnetic tunnel junction structure 41 and through the heat generating structure 211 wherein the write current has a magnitude sufficient to change a program state of the magnetic tunnel junction 41. In greater detail, the positive or negative write current (+IW or −IW) may pass through the bit line 49, the MTJ 41, the memory cell access transistor TA (including drain/source regions 7d and 7s), and the source line 13 (coupled to the electrical ground). More particularly, the write current may have a magnitude sufficient to generate heat at the heat generating layer to thereby heat the magnetic tunnel junction structure.

More particularly, the controller 501 may be configured to provide a first write current (e.g., positive write current +IW) in a first direction through the magnetic tunnel junction 41 and through the heat generating structure 211, and the first write current may have a magnitude sufficient to change a program state of the magnetic tunnel junction 41 to a first program state. The controller 501 may also be configured to provide a second write current (e.g., negative write current −IW) in a second direction through the magnetic tunnel junction 41 and through the heat generating layer 211, and the second write current may have a magnitude sufficient to change a program state of the magnetic tunnel junction 41 to a second program state. Moreover, the first and second directions may be different, and the first and second program states may be different.

The controller may also be configured to provide a read signal RS through the magnetic tunnel junction 41 and through the beat generating layer 211 wherein a magnitude of the read signal is insufficient to change a program state of the magnetic tunnel junction 41. The controller 501 may thus determine a program state of the magnetic tunnel junction structure responsive to the read signal. In greater detail, the read signal RS may pass through the bit line 49, the MTJ 41, the memory cell access transistor TA (including drain/source regions 7d and 7s), and the source line 13 (coupled to the electrical ground).

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of operating a magnetic random access memory (MRAM) device including a magnetic tunnel junction structure and a heat generating layer, the method comprising:
   providing a write current through the magnetic tunnel junction structure and through the heat generating layer wherein the write current has a magnitude sufficient to change a program state of the magnetic tunnel junction structure wherein the magnetic tunnel junction structure includes a pinned layer, a free layer, and a tunneling insulating layer between the pinned and free layers, wherein the heat generating layer and the tunneling insulating layer are spaced apart, and wherein the pinned layer, the free layer, the tunneling insulating layer, and the heat generating layer are electrically coupled in series so that the write current passes through each of the pinned layer, the free layer, the tunneling insulating layer, and the heat generating layer.

2. A method according to claim 1 wherein the heat generating layer comprises at least one of an aluminum oxide ($Al_2O_3$) layer, an undoped silicon (Si) layer, a silicon carbide (SiC) layer, a silicon oxide ($SiO_2$) layer, a silicon oxynitride (SiON) layer, and/or a chalcogenide layer.

3. A method according to claim 1 wherein the heat generating layer has a thickness of less than about 30 Å (Angstroms).

4. A method according to claim 1 wherein the magnetic tunnel junction structure and the heat generating layer are electrically connected in series between a bit line and a memory cell access transistor.

5. A method according to claim 4 wherein the heat generating layer is electrically connected between the magnetic tunnel junction structure and the memory cell access transistor.

6. A method according to claim 4 wherein the heat generating layer is electrically connected between the magnetic tunnel junction structure and the bit line.

7. A method according to claim 4 wherein a conductive plug is electrically connected between the magnetic tunnel junction structure and the memory cell access transistor and wherein the magnetic tunnel junction structure and the heat generating layer are electrically connected in series between the conductive plug and the bit line.

8. A method according to claim 7 wherein a contact area between the conductive plug and the heat generating layer is less than a contact area between the heat generating layer and the magnetic tunnel junction structure.

9. A method according to claim 4 wherein a conductive plug is electrically connected between the magnetic tunnel junction structure and the bit line and wherein the magnetic tunnel junction structure and the heat generating layer are electrically connected in series between the conductive plug and the memory cell access transistor.

10. A method according to claim 9 wherein a contact area between the conductive plug and the heat generating layer is less than a contact area between the heat generating layer and the magnetic tunnel junction structure.

11. A method according to claim 1 wherein the write current has a magnitude sufficient to generate heat at the heat generating layer to thereby heat the magnetic tunnel junction structure.

12. A method according to claim 1 further comprising:
   providing a read signal through the magnetic tunnel junction structure and through the heat generating layer wherein a magnitude of the read signal is insufficient to change a program state of the magnetic tunnel junction structure; and
   determining a program state of the magnetic tunnel junction structure responsive to the read signal.

13. A method according to claim 1 wherein the magnetic random access memory device further includes a bit line and a memory cell access transistor and wherein the magnetic tunnel junction structure and the heat generating layer are electrically connected in series between the memory cell access transistor and the bit line, wherein providing the write current comprises:
   turning on the memory cell access transistor; and
   applying a bit line write signal to the bit line while turning on the memory cell access transistor to thereby generate the write current through the magnetic tunnel junction structure and the heat generating layer.

14. A method according to claim 1 further comprising a semiconductor substrate wherein the heat generating layer is between the magnetic tunnel junction structure and the substrate.

15. A method according to claim 1 further comprising a semiconductor substrate wherein the magnetic tunnel junction structure is between the heat generating layer and the semiconductor substrate.

16. A method of operating a magnetic random access memory (MRAM) device including a magnetic tunnel junction structure and a heat generating layer, the method comprising:

providing a first write current in a first direction through the magnetic tunnel junction structure and through the heat generating layer wherein the first write current has a magnitude sufficient to change a program state of the magnetic tunnel junction structure to a first program state; and providing a second write current in a second direction through the magnetic tunnel junction structure and through the heat generating layer wherein the second write current has a magnitude sufficient to change a program state of the magnetic tunnel junction structure to a second program state, wherein the first and second directions are different and wherein the first and second program states are different.

17. A method according to claim 16 wherein the magnetic tunnel junction structure includes a pinned layer, a free layer, and a tunneling insulating layer between the pinned and free layers, wherein the heat generating layer and the tunneling insulating layer are spaced apart, and wherein the pinned layer, the free layer, the tunneling insulating layer, and the heat generating layer are electrically coupled in series so that the first and second write currents pass through each of the pinned layer, the free layer, the tunneling insulating layer, and the heat generating layer.

18. A magnetic random access memory (MRAM) device comprising:
   a memory cell access transistor on a substrate;
   an insulating layer on the memory cell access transistor and on the substrate;
   a bit line on the insulating layer such that the insulating layer is between the bit line and the substrate;
   a memory element including a magnetic tunnel junction structure and a heat generating layer electrically connected in series between the bit line and a source/drain region of the memory cell access transistor wherein the magnetic tunnel junction structure includes a pinned layer, a free layer, and a tunneling insulating layer between the pinned and free layers, wherein the heat generating layer and the tunneling insulating layer are spaced apart, and wherein the pinned layer, the free layer, the tunneling insulating layer, and the heat generating layer are electrically coupled in series; and
   a controller electrically connected to the bit line and the memory cell access transistor wherein the controller is configured to provide a write current between the bit line and the source/drain region of the memory cell access transistor through the magnetic tunnel junction structure and through the heat generating layer so that the write current passes through each of the pinned layer, the free layer, the tunneling insulating layer, and the heat generating layer wherein the write current has a magnitude sufficient to change a program state of the magnetic tunnel junction structure.

19. A magnetic random access memory according to claim 18 wherein the heat generating layer comprises at least one of an aluminum oxide ($Al_2O_3$) layer, an undoped silicon (Si) layer, a silicon carbide (SiC) layer, a silicon oxide ($SiO_2$) layer, a silicon oxynitride (SiON) layer, and/or a chalcogenide layer.

20. A magnetic random access memory according to claim 19 wherein the heat generating layer has a thickness of less than about 30 521 (Angstroms).

21. A magnetic random access memory according to claim 18 wherein the heat generating layer is electrically connected between the magnetic tunnel junction structure and the memory cell access transistor.

22. A magnetic random access memory according to claim 18 wherein the heat generating layer is electrically connected between the magnetic tunnel junction structure and the bit line.

23. A magnetic random access memory according to claim 18 further comprising:
   a conductive plug electrically connected between the magnetic tunnel junction structure and the memory cell access transistor and wherein the magnetic tunnel junction structure and the heat generating layer are electrically connected in series between the conductive plug and the bit line.

24. A magnetic random access memory according to claim 23 wherein a contact area between the conductive plug and the heat generating layer is less than a contact area between the heat generating layer and the magnetic tunnel junction structure.

25. A magnetic random access memory according to claim 18 further comprising:
   a conductive plug electrically connected between the magnetic tunnel junction structure and the bit line and wherein the magnetic tunnel junction structure and the heat gene rating layer are electrically connected in series between the conductive plug and the memory cell access transistor.

26. A magnetic random access memory according to claim 25 wherein a contact area between the conductive plug and the heat generating layer is less than a contact area between the heat generating layer and the magnetic tunnel junction structure.

27. A magnetic random access memory according to claim 18 wherein the write current has a magnitude sufficient to generate heat at the heat generating layer to thereby heat the magnetic tunnel junction structure.

28. A magnetic random access memory according to claim 18 wherein the controller is further configured to:
   provide a read signal through the magnetic tunnel junction structure and through the heat generating layer wherein a magnitude of the read signal is insufficient to change a program state of the magnetic tunnel junction structure; and
   determine a program state of the magnetic tunnel junction structure responsive to the read signal.

29. A magnetic random access memory according to claim 18 wherein the magnetic tunnel junction structure includes a pinned layer, a free layer, and a tunneling insulating layer between the pinned and free layers, wherein the heat generating layer and the tunneling insulating layer are spaced apart, and wherein the pinned layer, the free layer, the tunneling insulating layer, and the heat generating layer are electrically coupled in series so that the first and second write currents pass through each of the pinned layer, the free layer, the tunneling insulating layer, and the heat generating layer.

30. A magnetic random access memory (MRAM) device comprising:
   a memory cell access transistor on a substrate;
   an insulating layer on the memory cell access transistor and on the substrate;
   a bit line on the insulating layer such that the insulating layer is between the bit line and the substrate;
   a memory element including a magnetic tunnel junction structure and a heat generating layer electrically connected in series between the bit line and a source/drain region of the memory cell access transistor; and a controller electrically connected to the bit line and the memory cell access transistor, wherein the controller is configured to:

provide a first write current in a first direction between the bit line and the source/drain region of the memory cell access transistor through the magnetic tunnel junction structure and through the heat generating layer wherein the first write current has a magnitude sufficient to change a program state of the magnetic tunnel junction structure to a first program state, and provide a second write current in a second direction between the bit line and the source/drain region of the memory cell access transistor through the magnetic tunnel junction structure and through the heat generating layer wherein the second write current has a magnitude sufficient to change a program state of the magnetic tunnel junction structure to a second program state, wherein the first and second directions are different and wherein the first and second program states are different.

* * * * *

UNITED STATES PATENT AND TRADEMARK OFFICE
CERTIFICATE OF CORRECTION

| | | |
|---|---|---|
| PATENT NO. | : 7,372,722 B2 | Page 1 of 1 |
| APPLICATION NO. | : 11/263521 | |
| DATED | : May 13, 2008 | |
| INVENTOR(S) | : Jeong et al. | |

It is certified that error appears in the above-identified patent and that said Letters Patent is hereby corrected as shown below:

Column 19, Claim 20, Line 63:
Please correct "less than about 30 521 (Angstroms)."
      To read -- less than about 30 Å (Angstroms). --

Column 20, Claim 25, Line 23:
Please correct "gene rating"
      To read -- generating --

Signed and Sealed this

Twenty-ninth Day of July, 2008

JON W. DUDAS
*Director of the United States Patent and Trademark Office*